United States Patent
Fung et al.

(12)

(10) Patent No.: US 6,216,709 B1
(45) Date of Patent: Apr. 17, 2001

(54) METHOD FOR DRYING A SUBSTRATE

(75) Inventors: Robert Pui Chi Fung, San Mateo; David Paul Musser, San Jose; Jonathan Sanghun Cho, Redwood City, all of CA (US)

(73) Assignee: Komag, Inc., San Jose, CA (US)

( * ) Notice: Subject to any disclaimer, the term of this patent is extended or adjusted under 35 U.S.C. 154(b) by 0 days.

(21) Appl. No.: 09/186,048

(22) Filed: Nov. 3, 1998

Related U.S. Application Data
(60) Provisional application No. 60/099,159, filed on Sep. 4, 1998.

(51) Int. Cl.[7] .................................. B08B 3/04; B08B 7/04; C03C 23/00
(52) U.S. Cl. ............................ 134/25.4; 134/2; 134/26; 134/30; 134/32; 134/37; 134/95.2; 134/902
(58) Field of Search .................. 134/2, 25.4, 25.5, 134/26, 30, 32, 37, 95.2, 902

(56) References Cited

U.S. PATENT DOCUMENTS

| | | |
|---|---|---|
| 4,722,752 | 2/1988 | Steck ..................... 134/25.4 |
| 4,778,532 | 10/1988 | McConnell et al. .............. 134/10 |
| 4,911,761 | 3/1990 | McConnell et al. .............. 134/11 |
| 4,917,123 | 4/1990 | McConnell et al. .............. 134/95 |
| 4,984,597 | 1/1991 | McConnell et al. .............. 134/95 |
| 5,421,905 | * 6/1995 | Ueno et al. .............. 134/25.4 |
| 5,569,330 | 10/1996 | Schild et al. .............. 134/1 |
| 5,571,337 | 11/1996 | Mohindra et al. .............. 134/25.4 |
| 5,884,640 | * 3/1999 | Fishkin et al. .............. 134/95.2 |
| 5,902,402 | * 5/1999 | Durst et al. .............. 118/423 |

FOREIGN PATENT DOCUMENTS

| | | |
|---|---|---|
| 0 385 536 A1 | 9/1990 | (EP) . |
| WO 96/21241 | 7/1996 | (WO) . |
| WO 96/36068 | 11/1996 | (WO) . |

* cited by examiner

Primary Examiner—Zeinab El-Arini

(57) ABSTRACT

A method for drying workpieces in accordance with our invention includes the step of immersing the workpieces in a liquid, holding the workpieces with a first holding mechanism, slowly draining the liquid from the container until a first portion of the workpieces is exposed and dried, holding the workpieces with a second holding means at the first portion, and draining the remainder of the liquid from the container. Because of this, a drying portion of the workpiece is not held by a wet holding mechanism.

10 Claims, 7 Drawing Sheets

METHOD FOR DRYING A SUBSTRATE

This patent claims priority based on U.S. Provisional Patent Application No. 60/099,159, filed on Sep. 4, 1998.

BACKGROUND OF THE INVENTION

This invention relates to a method and apparatus for drying a workpiece such as a substrate used in magnetic disk or integrated circuit manufacturing.

In many manufacturing processes it is necessary to treat a workpiece with a liquid and then dry the workpiece. For example, during the manufacturing of magnetic disks, one typically performs the following manufacturing steps:

1. First a nickel-phosphorus layer is plated onto an aluminum substrate;
2. The nickel-phosphorus layer is polished and textured;
3. The substrate is cleaned, rinsed and dried;
4. A series of layers are sputtered onto the substrate, e.g., an underlayer such as sputtered NiP or Cr, a magnetic cobalt alloy, and a protective hydrogenated carbon overcoat.

Immediately prior to sputtering, the substrate is cleaned and then dried. It is extremely important that when the substrate is dried, there are no impurities left on its surface.

Numerous other manufacturing processes require drying a workpiece. For example, during various semiconductor manufacturing process steps, semiconductor wafers are immersed in a liquid and then dried. It is critical that there be no impurities on the surface of these wafers after drying.

One structure for drying semiconductor wafers is discussed in European Patent Application 0 385 536 A1, incorporated herein by reference. In the '536 apparatus, a cassette of wafers is immersed in a liquid and then slowly removed from the liquid in the presence of a vapor that aids in the drying process. The cooperation of this vapor and liquid creates the so-called Marangoni effect which permits drying of the wafer without leaving "drying marks".

During the drying process, a wafer holding mechanism is always in contact with the wafer. This leaves the possibility that there will be a contamination or drying mark at the point where the wafer is held during drying. One object of our invention is to overcome this problem.

SUMMARY

Drying apparatus in accordance with our invention comprises a container for holding a liquid and first and second structures for holding one or more workpieces. The workpiece is held by the first structure while the workpiece and the first structure are immersed in the liquid. (The second structure is also typically immersed in the liquid.) Thereafter, the liquid is slowly drained from the container until a first portion of the workpiece and a portion of the second structure are exposed and dried. Thereafter, the dry portion of the second structure is used to hold the first portion of the workpiece. The first structure is then removed from contact with the workpiece and the remainder of liquid is drained from the container. After the first structure and the remainder of the workpiece are dried, the first structure withdraws the workpiece from the container.

BRIEF DESCRIPTION

DETAILED DESCRIPTION

Referring to FIGS. 1A to 1D, apparatus 10 in accordance with our invention comprises a holder 12 for holding one or more workpieces such as substrates 14. In one embodiment, substrates 14 can be substrates used during the manufacture of magnetic disks. Such substrates typically have a diameter of 65, 84, 95 or 130 mm. However, this apparatus may also be used in conjunction with substrates having other shapes and diameters, or in other manufacturing processes, e.g., semiconductor manufacturing.

Figure 1A:
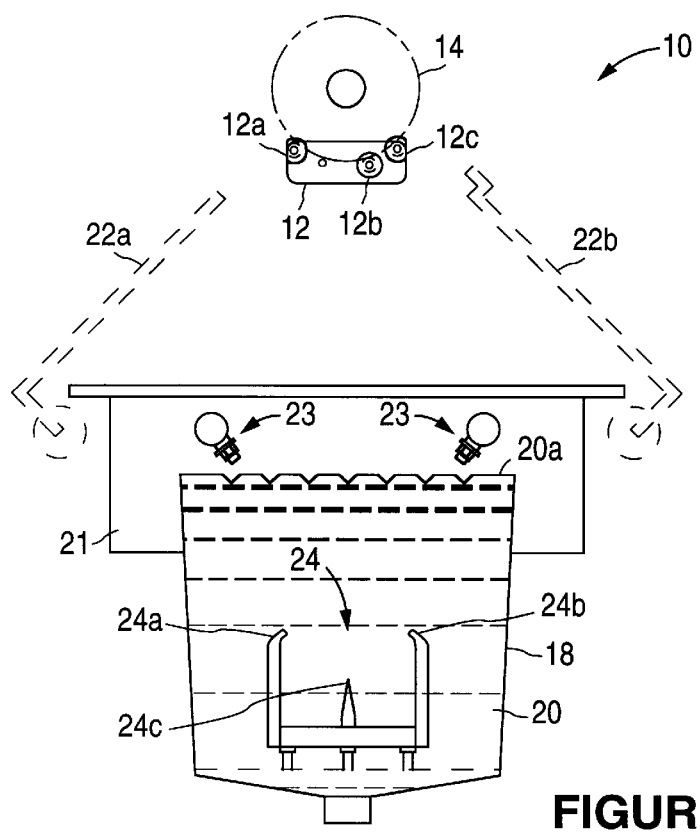
FIGS. 1A to 1D illustrate apparatus for drying a workpiece in accordance with a first embodiment of our invention during a drying process.
Figure 1B:
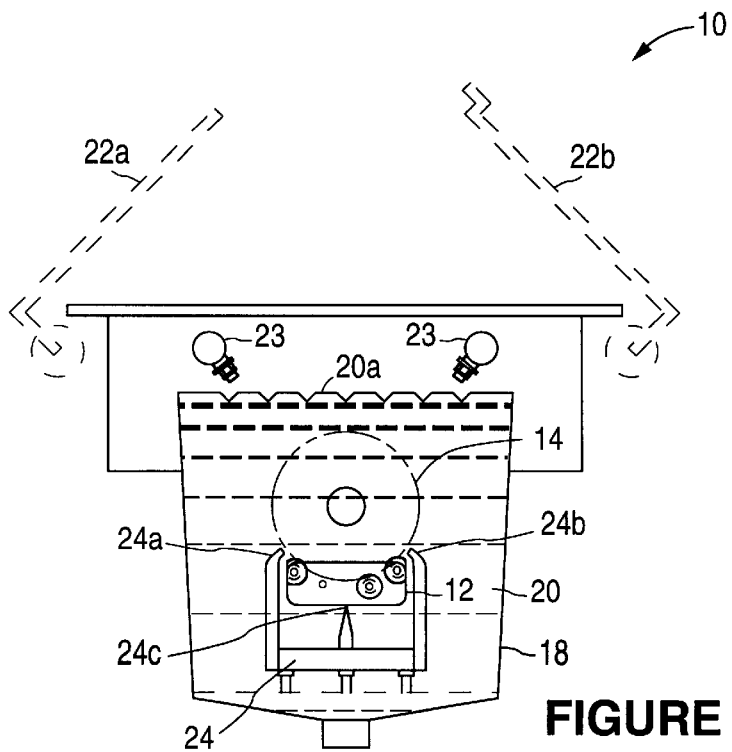

Holder 12 comprises three cylindrical members 12a and 12b, 12c, having notches 16 formed therein (FIG. 2A) for supporting substrates 14. One end of members 12a to 12c is connected to a plate 15a and the other end to a plate 15b. Members 12a to 12c are on a carrier 17 FIG. 2A. As shown in FIG. 1B, substrates 14 are then lowered by holder 12 into a container 18 containing a liquid 20 such as deionized water. In one embodiment, carrier 17 rides on a threaded screw (not shown) which is rotated by a motor (not shown) to raise and lower holder 12. When being raised and lowered, carrier 17 rides along a ball or cross roller slide 19.

Container 18 is typically filled to overflowing with liquid 20. An overflow channel 21 surrounds the top of container 18 to receive overflowing excess water. Container covers 22a, 22b close over the top of container 18 after substrates 14 are immersed in liquid 20.

Although our invention can be used in conjunction with numerous manufacturing processes at a variety of temperatures, in one manufacturing process, water 20 is at room temperature. After being immersed in water 20 for a suitable length of time, the water is slowly drained from container 18 while a drying gas is pumped into container 18 by gas manifolds 23. In one embodiment, the gas provided by manifolds 23 comprises isopropyl alcohol ("IPA") vapor and nitrogen at one atmosphere of pressure and room temperature. The IPA concentration can vary from 0.5 to 4.0 ml/run.

Figure 1C:
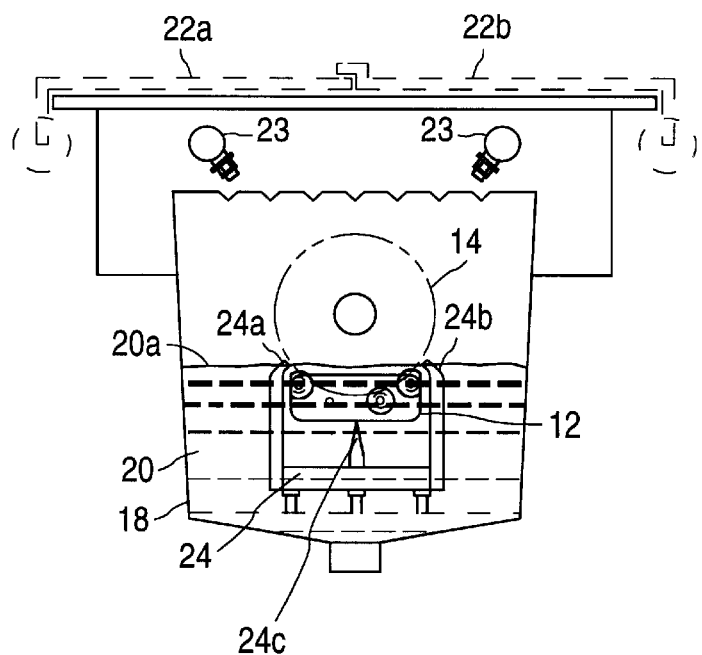

The top surface 20a of water 20 is lowered at a rate between 0.1 and 3 mm/sec, and preferably about 1 mm/sec. The drain rate is precisely controlled by a drain or needle valve. Referring to FIGS. 1A to 1D and 2B, also within container 18 is a holder 24 comprising first and second elongated holding members 24a, 24b and knife support 24c. Holding members 24a, 24b have notches 26 formed therein for supporting substrates 14. After the surface 20a of water 20 falls below the top of holding members 24a, 24b, and the top of holding members 24a, 24b are dry, holder 12 is lowered so that substrates 14 rest against and are supported by holder 24 (FIG. 1C). Holder 12 must be lowered at a rate slower than the rate surface 20a of water 20 is falling. This permits surface 20a of water 20 to continue to fall relative to substrate 14 while lowering holder 12. Of importance, at this time, substrates 14 are supported entirely by dry surfaces (with the exception of knife support 24c). This helps prevent staining or "drying marks" from remaining on substrates 14 after drying.

Figure 1D:
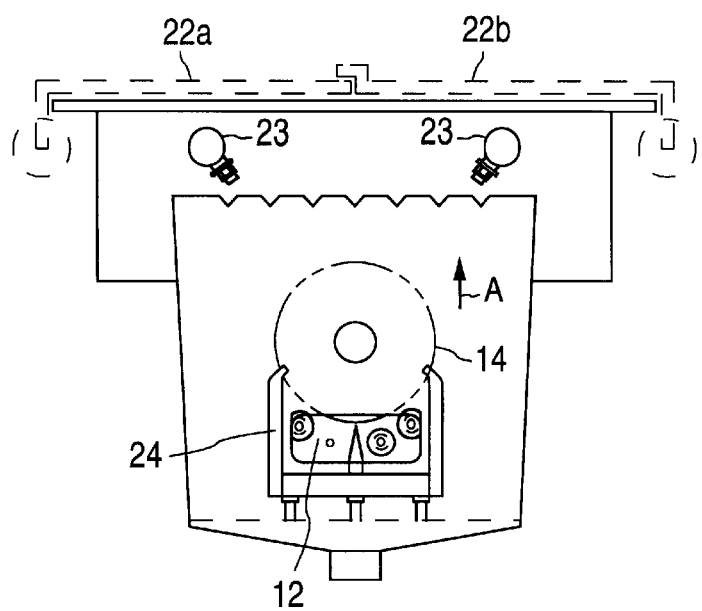

Referring to FIG. 1D, the remainder of water 20 is drained from container 18 while substrates 14 are supported by holder 24.

In one embodiment, after water 20 is drained from container 18, a heated dry vapor can be sprayed through manifolds 23 (or other manifolds within the apparatus) to further guarantee substrate 14 dryness. The heated gas can be nitrogen between room temperature and 160° F., and preferably between 80 and 160° F.

As soon as holder 12 is dry, container covers 22a and 22b open and holder 12 is raised in a direction A, and carries substrates 14 upwardly and outside of container 18.

In the embodiment of FIGS. 1A to 1D, knife support 24c remains in contact with substrates 14 as water surface 20a recedes below the knife-substrate contact point. Knife 24c is used because we believe that knife 24c may aid in permitting water to flow off of substrates 14 during drying.

Figure 2A:
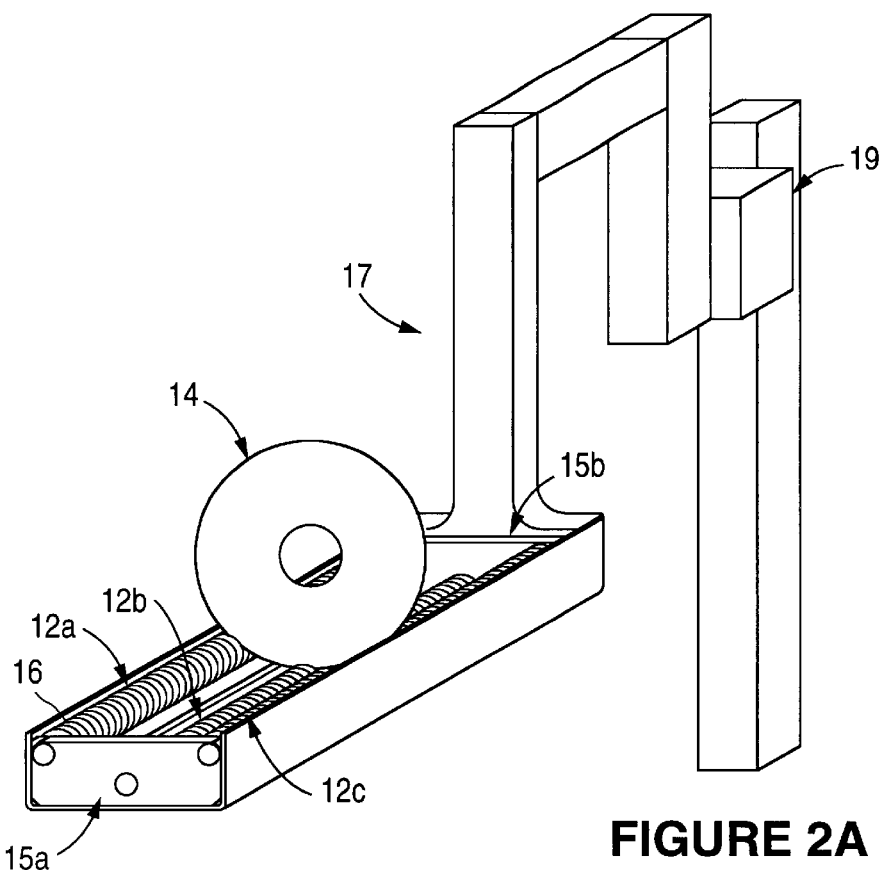
FIG. 2A is a perspective view of holding members 12a, 12b and 12c of FIGS. 1A to 1D.
Figure 2B:
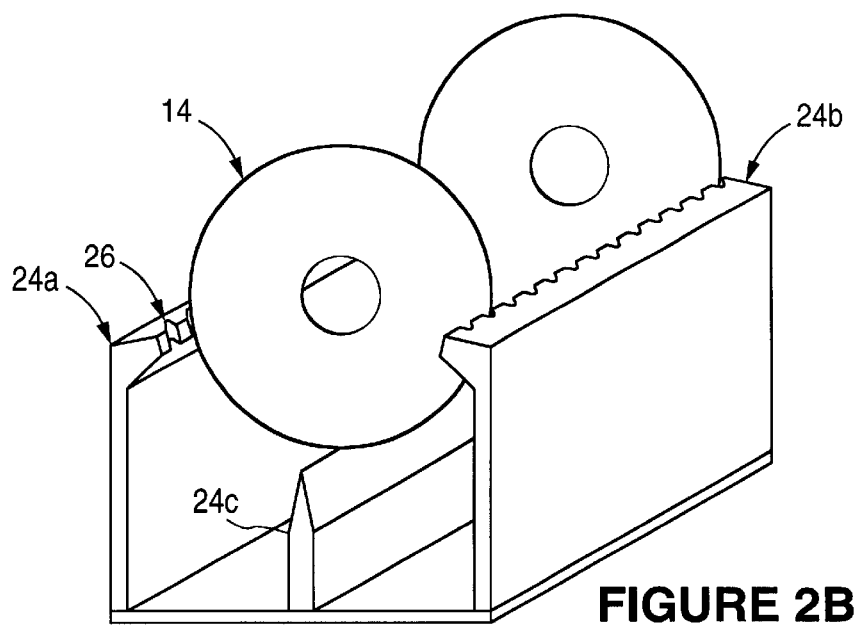
FIG. 2B is a perspective view of holding members 24a, 24b and knife 24c of FIGS. 1A to 1D.

Cylindrical members 12a to 12c of holder 12 can be made of any appropriate solid material. In one embodiment, members 12a to 12c are made from UHMWPE (ultra high molecular weight poly ethylene) formed around stainless steel cores (FIG. 2A). In addition, holding members 24a, 24b can also be made from UHMWPE. Knife 24c can be made from PEEK (polyether etherketone).

While holder 12 holds substrate 14 at three points of contact, other embodiments comprise a holder which supports substrate 14 at two, four, or another number of contact points. Holder 12 can be made using single or multiple piece construction.

Figure 3A:
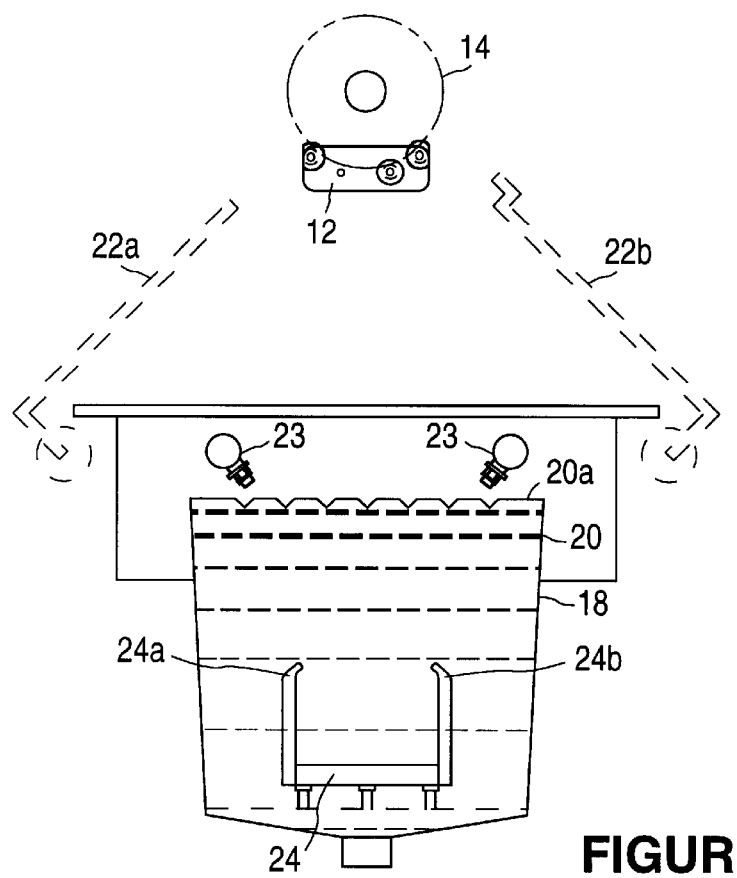
FIGS. 3A to 3D illustrate a second embodiment of apparatus for drying a workpiece during a drying process.
Figure 3B:
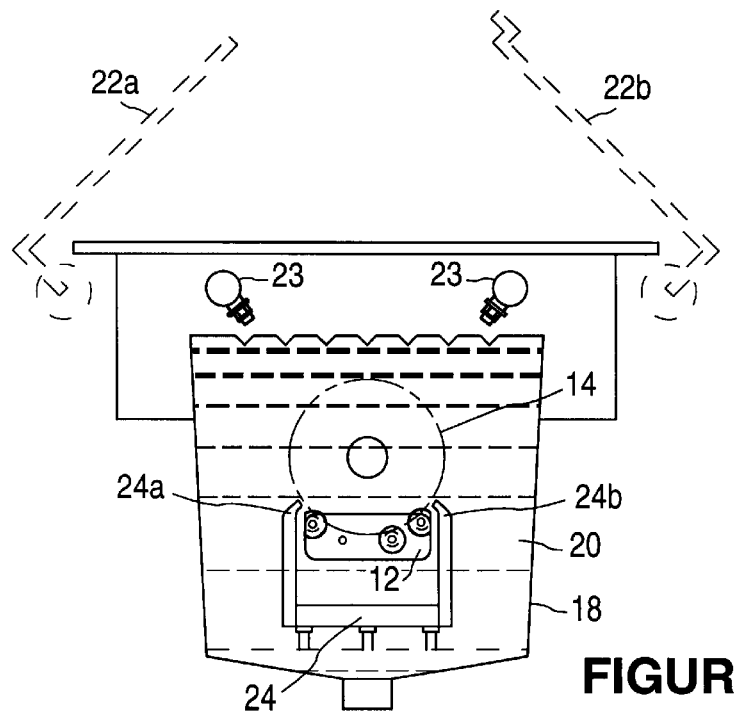
Figure 3C:
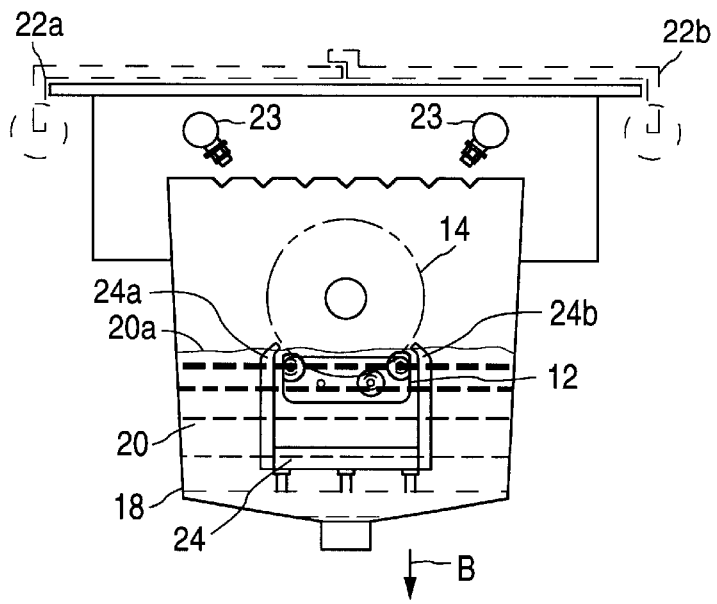
Figure 3D:
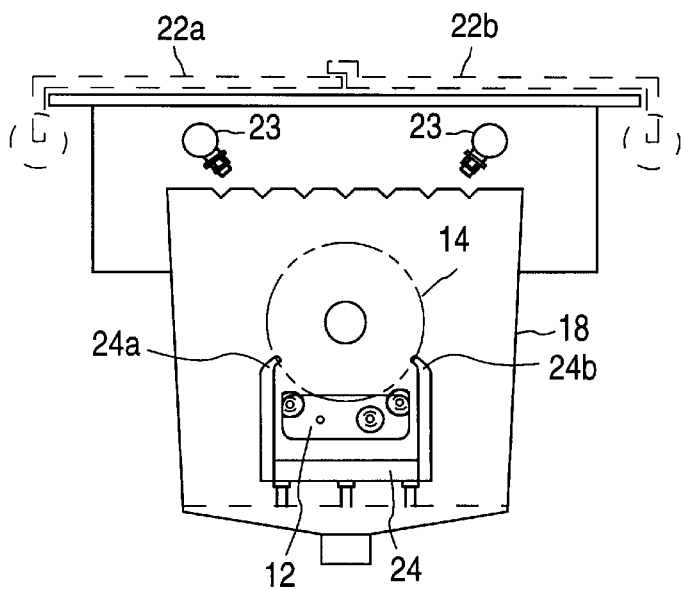

FIGS. 3A to 3D illustrate another embodiment of our invention which is the same as the embodiment of FIGS. 1A to 1D and 2A to 2B, except that knife 24c is not present. As with the embodiment of FIGS. 1A to 1D and 2A to 2B, substrates 14 are initially held by holder 12 (FIG. 3A). Substrates 14 are lowered into water 20 by holder 12 (FIG. 3B). Covers 22a, 22b are then closed. Water 20 is then slowly drained from container 18 while a drying gas is provided in container 18 via manifolds 23. After the top of holding members 24a, 24b are exposed and dry (FIG. 3C), holder 12 is lowered (in direction B) so that dry portions of substrates 14 are held by dry portions of holding members 24a, 24b. The remainder of water 20 is then drained from container 18 (FIG. 3D). When substrates 14 and holder 12 are dry, covers 22a and 22b open and holder 12 lifts substrates 14 out of container 18.

In another embodiment, after substrates 14 are rinsed in water 20, instead of simply draining water 20 from container 18, holder 12 pushes substrates 14 above surface 20a of water 20 while the top of holding members 24a, 24b are also pushed above top surface 20a of water 20. As soon as the portions of members 24a, 24b are dry, members 24a, 24b are pushed upwardly until they are supporting substrates 14 at a dry portion of substrates 14. Members 24a, 24b continue to be pushed upwardly until all of substrates 14 are dry. Holder 12 is then pushed out of water 20. When holder 12 is dry, it is pushed upwardly until it is supporting substrates 14. Holder 12 then lifts substrates 14 out of container 18. Alternatively, instead of pushing holder 12 out of the water, water 20 at that point can be drained from container 18.

Figure 4A:
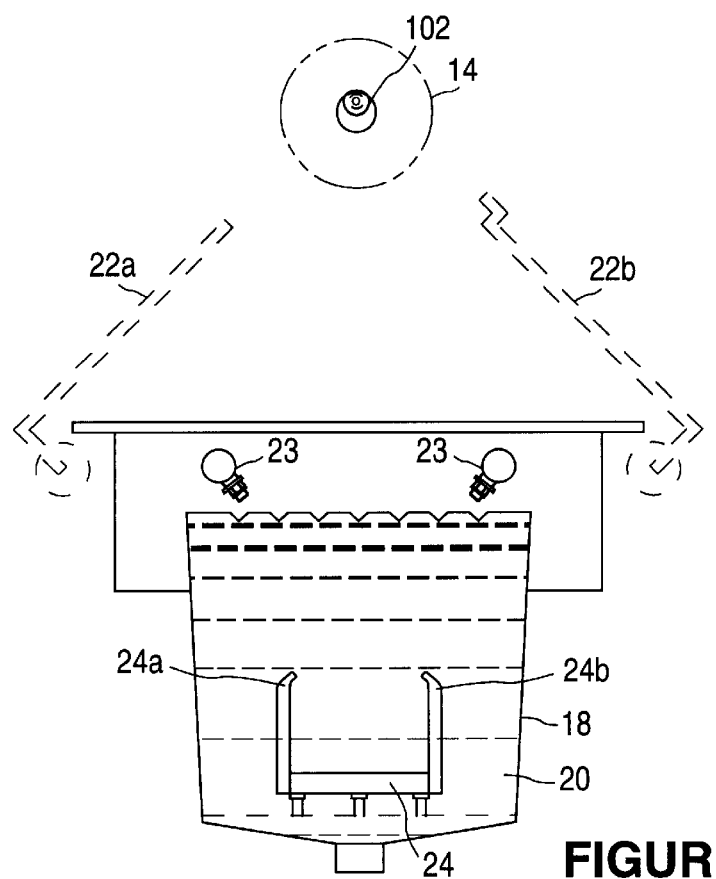
FIGS. 4A to 4D illustrate a third embodiment of apparatus for drying a workpiece during a drying process.
Figure 4B:
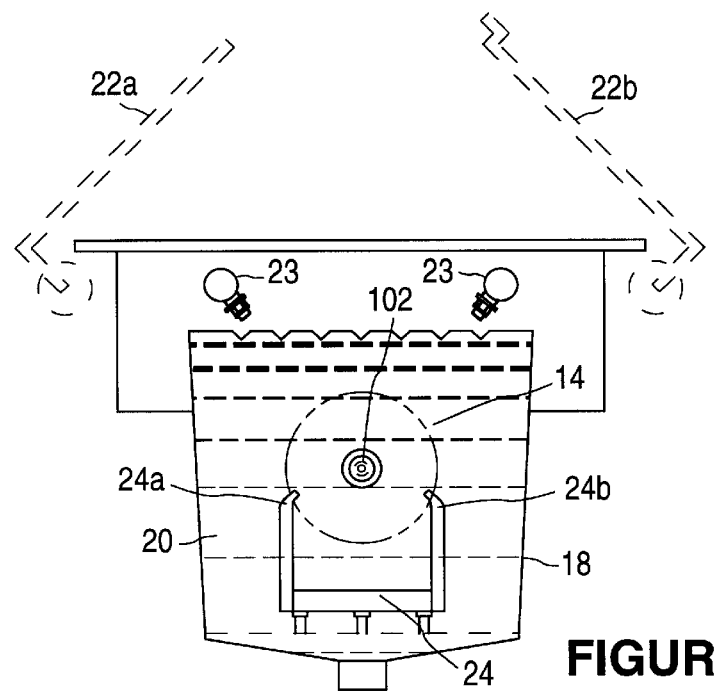
Figure 4C:
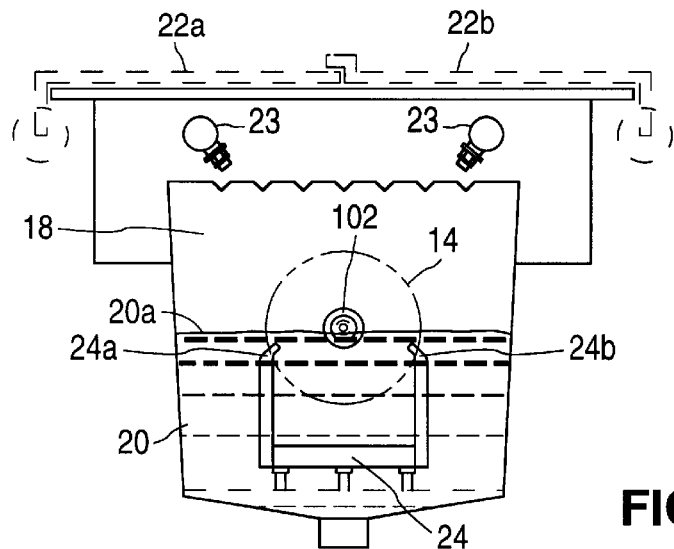
Figure 4D:
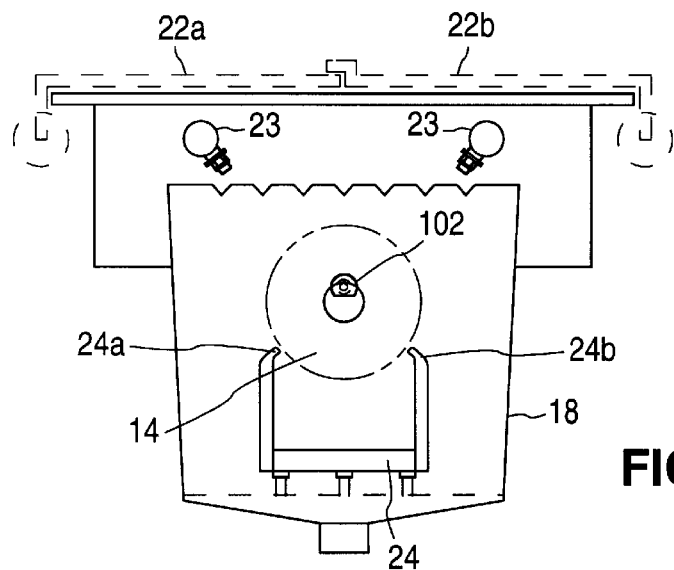
Figure 5:
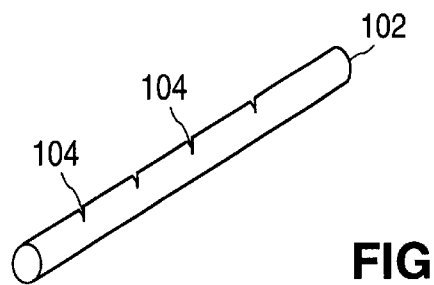
FIG. 5 illustrates holding member 102 of FIGS. 4A to 4D

FIGS. 4A to 4D illustrate another embodiment of our invention in which substrates 14 are held at their inner diameter by a holding member 102. Holding member 102 is shaped to optimize drying (see FIG. 5), and comprises notches 104 for holding the inner diameter edge of substrates 14, e.g., as shown in FIG. 5. Holding member 102 then immerses substrates 14 in container 18 of water 20 for rinsing purposes (FIG. 4B). Cover 22a, 22b are then closed. Thereafter, substrates 14 are left resting against holding members 24a, 24b while holding member 102 is lowered so that it no longer contacts substrates 14. Water 20 is then slowly drained from container 18 until the top surface 20a of water 20 is below holding member 102. Concurrently, a drying gas is provided in container 18 by manifolds 23. Referring to FIG. 4C, as soon as holding member 102 is dry (but before surface 20a of water 20 falls below holding members 24a, 24b), holding member 102 moves upwardly and lifts substrates 14 (at a dry portion of substrates 14) so that substrates 14 no longer contact holding members 24a, 24b. Thereafter, the remainder of water 20 is drained from container 18 and the substrates 14 are dried (FIG. 4D). Covers 22a, 22b are then opened and substrates 14 are removed from container 18 by holding member 102. Of importance, at no time during the drying process does a drying portion of substrates 14 contact a wet holding structure.

Although holder 24 of FIGS. 4A to 4D holds substrate 14 at two points of contact with two members 24a, 24b, three or more members can be used in holder 24, including a knife edge support.

While the invention has been described with respect to specific embodiments, those skilled in the art will recognize that changes can be made in form and detail without departing from the spirit and scope of the invention. For example, the various holding mechanisms and containers may be constructed from any appropriate material. In lieu of deionized water, our invention can be used in conjunction with other liquids. Such liquids can be used for washing, rinsing or performing other manufacturing processes in conjunction with the substrates. In lieu of isopropyl alcohol, other vapors such as those mentioned in the '536 Application can be used. In lieu of nitrogen, other carrier gases such as helium, argon or other inert gas can be used. In yet another embodiment, a carrier gas is not used. Accordingly, all such changes come within our invention.

We claim:

1. A method for drying a workpiece comprising the steps of:
   holding the workpiece with a first holding structure while the workpiece is immersed in a liquid within a container, said liquid having a surface;
   causing a portion of said workpiece to extend out of said liquid;
   holding the workpiece at said portion with a second holding structure after said causing said portion of said workpiece to extend out of said liquid; and
   causing said workpiece to be taken out of contact with said liquid, wherein said second holding structure comprises two side supports fixedly coupled to a knife edge support such that said two side supports and said knife edge do not move relative to one another during said drying, said knife edge support being lower than the two side supports.

2. Method of claim 1 wherein the workpiece has an edge, a portion of said edge extending lower than the rest of the workpiece, the knife edge support contacting said portion of the edge of said workpiece during said holding of the workpiece at said portion.

3. Method of claim 1 wherein said causing a portion of said workpiece to extend out of said liquid comprises removing a portion of the liquid from the container.

4. Method of claim 1 wherein said causing a portion of said workpiece to extend out of said liquid comprises lifting said workpiece.

5. Method of claim 1 wherein said causing said workpiece to be taken out of contact with said liquid comprises removing at least a portion of the liquid from the container.

6. Method of claim 1 wherein said causing said workpiece to be taken out of contact with said liquid comprises lifting said workpiece out of contact with said liquid.

7. Method of claim 1 further comprising depositing a magnetic alloy layer on said workpiece after said causing said workpiece to be taken out of contact with said liquid.

8. Method of claim 7 further comprising depositing an underlayer on said workpiece after said causing said workpiece to be taken out of contact with said liquid but before said depositing said magnetic alloy layer.

9. A method for drying a workpiece comprising the steps of:

holding said workpiece in a bath with a first holding structure, said bath being within a container;

providing a second holding structure within said bath;

removing liquid from said bath so that a top surface of said liquid drops below at least a portion of the second holding structure;

lowering the workpiece so that said workpiece is supported by said portion of the second holding structure after the top surface of said liquid drops below said portion of the second holding structure;

continuing to remove said liquid from said bath.

10. Method of claim 9 wherein said workpiece is lifted out of said container by said first holding structure after said step of continuing to remove said liquid from said bath.

* * * * *